(12) United States Patent
Stewart (10) Patent No.: US 6,683,791 B1
(45) Date of Patent: Jan. 27, 2004

(54) CIRCUIT BOARD ASSEMBLY WITH SOLDER COVER

(75) Inventor: Thomas E. Stewart, Saratoga, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/364,969

(22) Filed: Feb. 10, 2003

(51) Int. Cl.[7] ................................. H05K 1/14

(52) U.S. Cl. ................ 361/784; 361/801; 361/797; 361/752; 361/685

(58) Field of Search ................ 361/784, 737, 361/752, 797, 801, 754, 825, 685, 715, 684, 683

(56) References Cited

U.S. PATENT DOCUMENTS 5,207,586 A * 5/1993 MacGregor et al. ....... 439/76.1
5,502,604 A * 3/1996 Furay ..................... 360/97.01

* cited by examiner

Primary Examiner—Randy Gibson
Assistant Examiner—Hung Bui
(74) Attorney, Agent, or Firm—Park, Vaughan & Fleming LLP (57) ABSTRACT

A circuit board assembly that includes a circuit board. The circuit board includes a plurality of electrical contacts. The circuit board assembly also includes a solder cover that covers the electrical contacts. The solder cover includes a cover and a sliding-flange that is coupled to the cover. The circuit board assembly includes a retainer for restraining the solder cover. The retainer includes a mounting-flange and a retaining-flange.

24 Claims, 7 Drawing Sheets

CIRCUIT BOARD ASSEMBLY WITH SOLDER COVER

FIELD OF THE INVENTION

The present invention generally relates to circuit board assemblies. More specifically, the invention relates to circuit board assemblies that include solder covers.

BACKGROUND

Many modern industrial computer systems are designed so that the functionality of the computer system can be rapidly modified. Instead of utilizing a "motherboard" as found in most desktop computer systems, many modern industrial computers utilize a backplane that includes a number of connectors for receiving circuit board assemblies. These circuit board assemblies can provide a large number of functions. For example, such circuit board assemblies may include memory, microprocessors, network interfaces, and/or video. As a result, it is relatively easy to increase functionality of an industrial computer system. One simply installs a circuit board assembly that includes the components needed to provide the additional functionality.

Many industrial computer systems allow circuit board assemblies to be installed and removed when the computer system is operational. When a circuit board assembly is installed (hot plugged) in an operational computer, damage to the circuit board assembly and/or the computer system can result if an electrical component of the circuit board assembly contacts any other electrical components. In order to prevent such damage, circuit board assemblies often include solder covers. Solder covers provide a physical barrier between the exposed contacts of electrical components that are inside of the solder cover and other electrical components. Thus, when circuit board assemblies with solder covers are hot plugged into computer systems, no damage results.

Conventional solder covers utilize fasteners such as rivets or bolts to secure the solder cover to a circuit board. However, these fasteners, which pass through the circuit board, limit the locations of electrical components on the circuit board. In particular, such fasteners, which require a hole through the circuit board, limit the locations in which electrical components can be installed on the "backside" of the circuit board. Thus, a need exists for a circuit board assembly, which includes a solder cover that does not limit the locations in which electrical components can be installed on the backside of the circuit board.

SUMMARY OF THE INVENTION

One embodiment of the invention is a circuit board assembly. The circuit board assembly includes a circuit board with a plurality of holes. The holes receive fasteners. The circuit board also includes a plurality of electrical contacts. In addition, the circuit board assembly includes a solder cover that covers the electrical contacts. The solder cover includes a cover and a plurality of fastener-flanges. Each of the fastener-flanges includes a hole. The solder cover also includes a sliding-flange. The circuit board assembly further includes a retainer for restraining the solder cover. The retainer includes a mounting-flange and a retaining-flange. The retaining-flange is parallel to but is not co-planar to the mounting-flange. The circuit board assembly also includes a plurality of fasteners that pass through the holes in the circuit board and the holes in the fastener-flanges.

Another embodiment of the invention is another circuit board assembly. The circuit board assembly includes a circuit board. The circuit board includes a plurality of electrical contacts. The circuit board assembly also includes a solder cover that covers the electrical contacts. The solder cover includes a cover and a sliding-flange that is coupled to the cover. The circuit board further includes a retainer for restraining the solder cover. The retainer includes a mounting-flange and a retaining-flange.

Still other embodiments of the invention are the solder covers and the retainers discussed above.

Yet another embodiment of the invention is a method of assembling a circuit board assembly. The method includes attaching a retainer to a circuit board. The retainer includes a retaining-flange. The method also includes inserting a sliding-flange of a solder cover between at least a portion of the retaining-flange and the circuit board.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

5.1 A Circuit Board Assembly with One Retainer

Figure 1A:
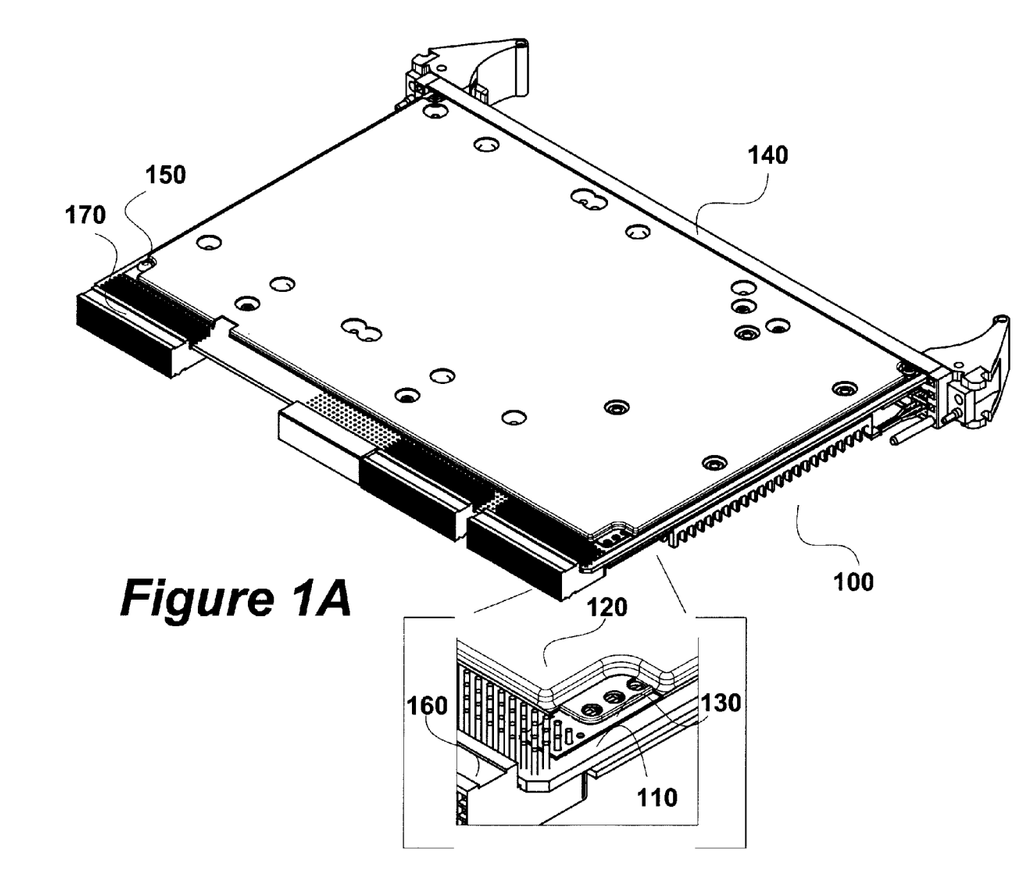
FIG. 1A presents an isometric view of a circuit board assembly.
Figure 1B:
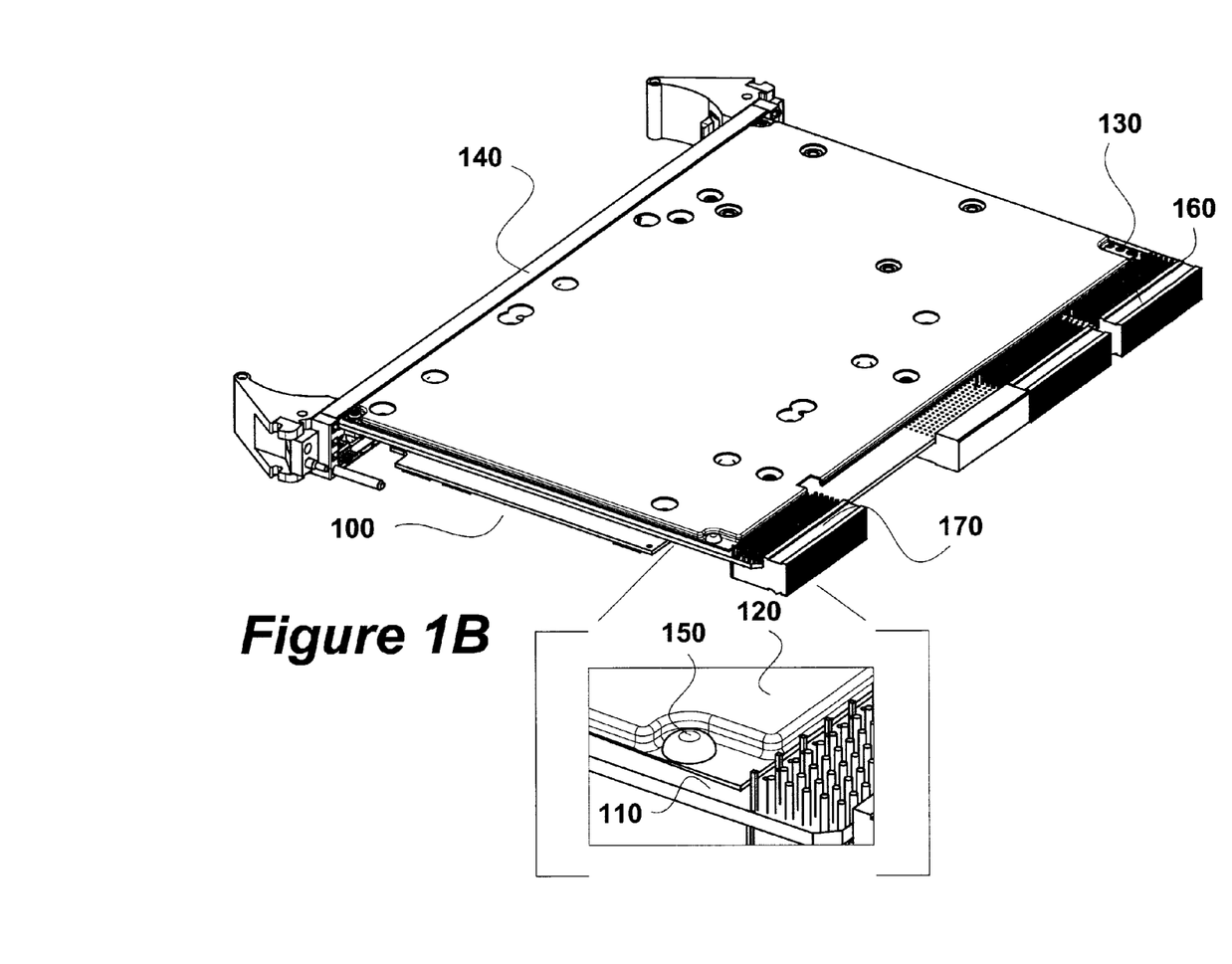
FIG. 1B presents another isometric view of a circuit board assembly.

One embodiment of the invention is the circuit board assembly 100 shown in FIG. 1A and FIG. 1B. The circuit board assembly 100 can be compliant with Version 2.0 of the CompactPCI specification.

FIG. 1A presents a full view and a detail view of the circuit board assembly 100. As shown in FIG. 1A, the circuit board assembly 100 includes a circuit board 110 that can contain a number of electrical components. In addition, the circuit board assembly 100 includes a solder cover 120. As discussed above, the solder cover 120 provides a barrier that isolates electrical components. The circuit board assembly 100 further includes a retainer 130 that retains the solder cover 120. As shown in FIG. 1A, the circuit board assembly 100 also includes a front panel assembly 140. The front panel assembly 140 is utilized to install and retain the circuit board assembly into an industrial computer system.

FIG. 1B presents another full view and detail view of the circuit board assembly 100. As shown in FIG. 1B, the circuit board assembly 100 includes a rivet 150, which retains the solder cover 120.

Figure 2A:
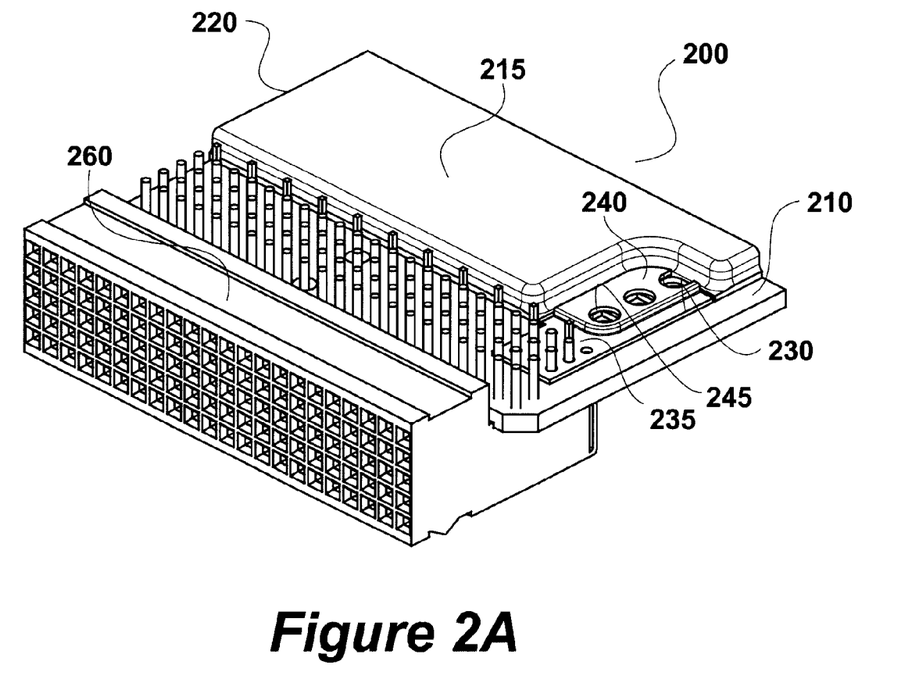
FIG. 2A presents an isometric view of a portion of a circuit board assembly.
Figure 2B:
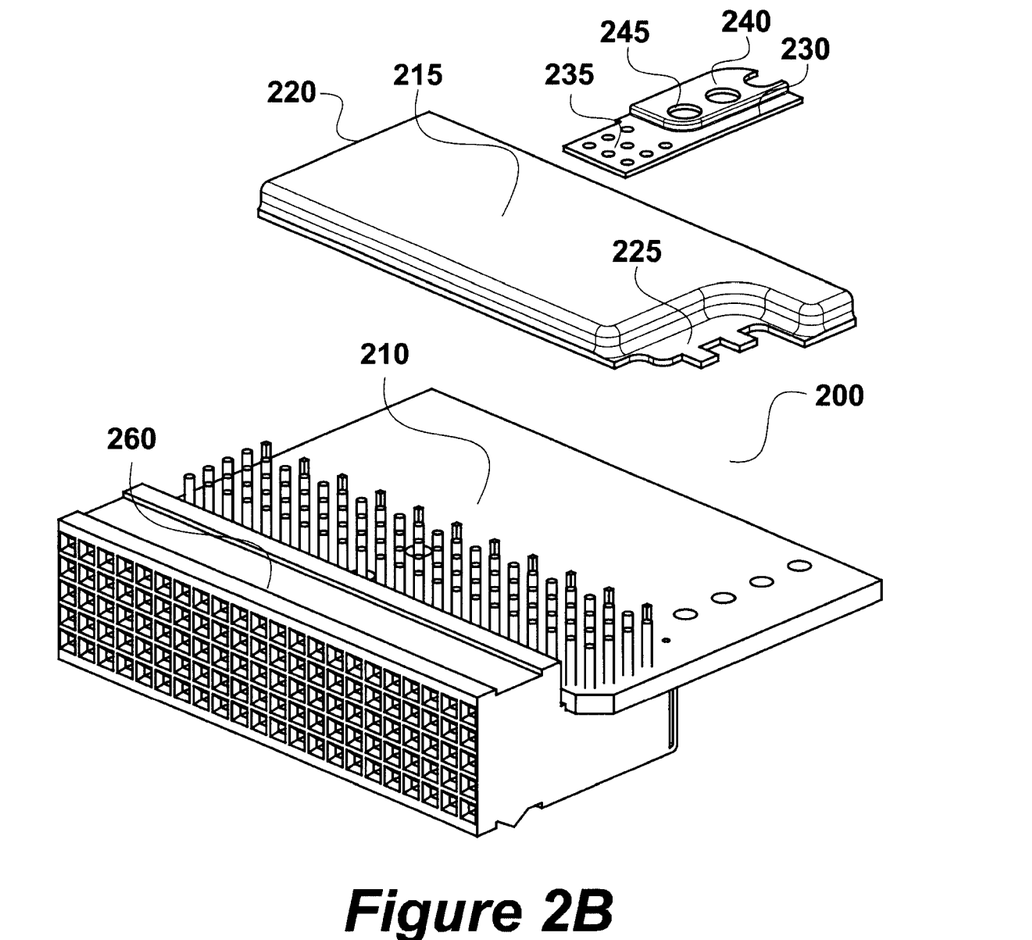
FIG. 2B presents an exploded isometric view of a portion of a circuit board assembly.

FIG. 2A and FIG. 2B present two views of a circuit board assembly 200. The circuit board assembly 200 is a portion of the circuit board assembly 100 shown in FIG. 1A and FIG. 1B. FIG. 2A presents the portion of the circuit board assembly 200 in assembled form. FIG. 2B presents an exploded view of the portion of the circuit board assembly 200.

As shown in FIG. 2A and FIG. 2B, the circuit board assembly 200 includes a retainer 230 for retaining the solder cover 220. In some embodiments of the invention, the retainer 230 and/or the solder cover 220 do not conduct electricity. For example, the retainer 230 could be molded from plastic.

As shown in FIG. 2A and FIG. 2B, the retainer 230 includes a mounting-flange 235. One side of the mounting-flange 235 is attached to the circuit board 210. For example, the mounting-flange 235 may be attached to the circuit board with an adhesive such as Master Bond's EP65HP-1 adhesive. As shown in FIG. 2B, the mounting-flange 235 may include a plurality of holes. For example, as shown in FIG. 2A, the mounting-flange 235 can include a plurality of holes that receive terminals of connector 260. The use of holes in the mounting-flange 235 allows valuable surface area of the circuit board 210 to be utilized for multiple purposes. For example, the surface area of the circuit board 210 can be utilized for receiving the terminals of the connector 260 and can be simultaneously utilized to attach the retainer 230 to the circuit board 210. In other embodiments of the invention (not shown), a hole in the mounting-flange of the retainer could be utilized to attach the retainer to the circuit board.

Retainer 230 also includes a retaining-flange 240. The retaining-flange 240 is typically parallel to, but not co-planar with, the mounting-flange 235. As a result, when the retainer 230 is mounted onto the circuit board 210, a slot is formed between the retaining-flange 240 and the circuit board 210. As shown in FIG. 2B, the retaining-flange 240 can also include a plurality of holes, such as the hole 245. The holes can be utilized as an aide during assembly of the circuit board assembly 200. The holes can also be utilized to receive terminals from other components that are attached to the reverse side of the circuit board 210.

The circuit board assembly 200 of FIG. 2A and FIG. 2B also includes a solder cover 220. The cover 215 of the solder cover 220 provides the physical barrier over the electronic components of the circuit board 210. In some embodiments of the invention, there are components connected to the circuit board 210 that need to be accessed through the solder cover 220. Therefore, access holes can be located in the cover 215 of the solder cover 220.

The solder cover 220 also includes a sliding-flange 225, which is coupled to the cover 215. During assembly of the circuit board assembly 200, the sliding-flange 225 is inserted into the slot created when the retainer 230 is mounted onto the circuit board 210.

Figure 3A:
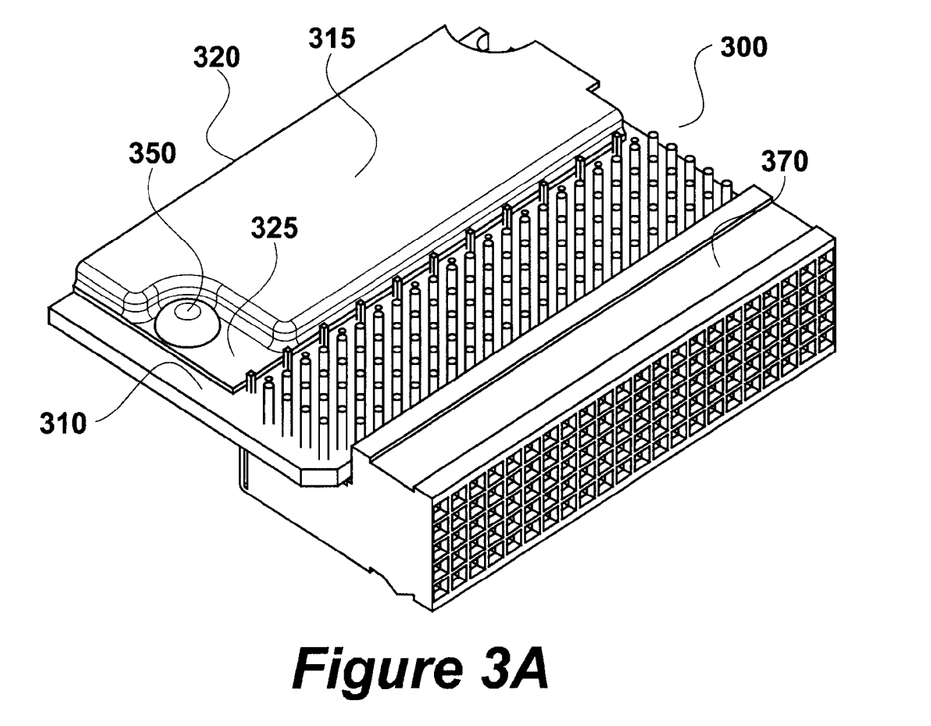
FIG. 3A presents an isometric view of a portion of a circuit board assembly.
Figure 3B:
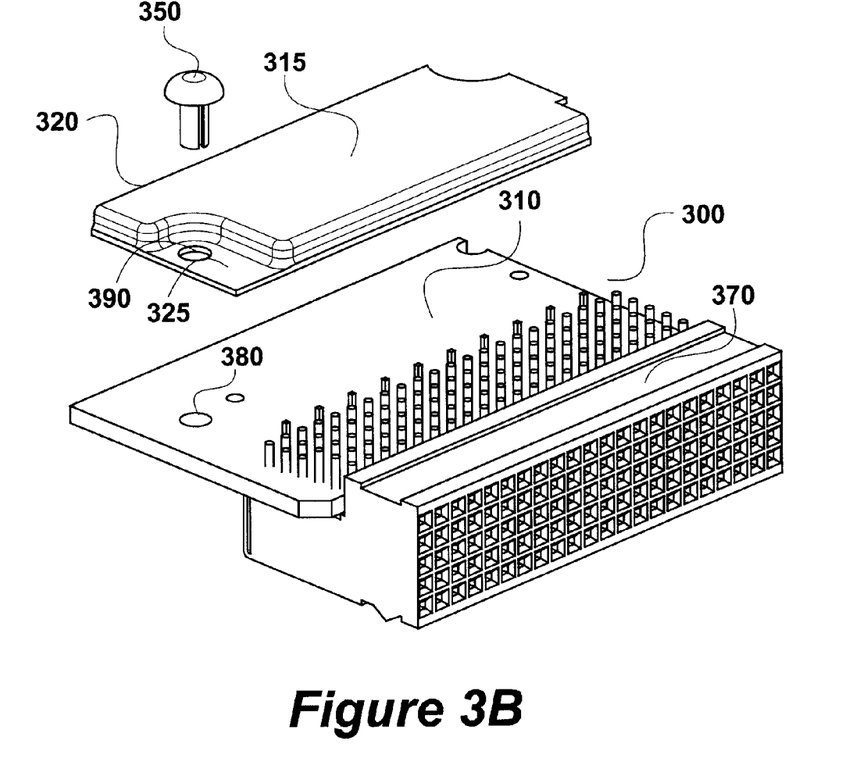
FIG. 3B presents an exploded isometric view of a portion of a circuit board assembly.

As shown in FIG. 3A and FIG. 3B, the solder cover 320 can also include one or more fastener-flanges 325 which are coupled to the cover 315. The fastener-flange 325 has a surface that mates with the circuit board 310. Typically, the fastener-flange 325 would be co-planar with the mounting surface of the mounting-flange 235 shown in FIG. 2B.

The fastener-flange 325 shown in FIG. 3B has a hole 390 which is aligned with a hole 380 on the circuit board 310. The solder cover 320 is fixed to the circuit board 310 via a fastener 350. For example, a pop-rivet could be utilized. The pop-rivet would pass through hole 390 on the fastener-flange 325 and then pass through hole 380 on the circuit board 310, fixing the solder cover 320 to the circuit board 310. Other fasteners, such as screws or bolts, could also be utilized.

5.2 A Circuit Board Assembly with Multiple Retainers

A circuit board assembly can include a solder cover with one or more sliding-flanges and one or more fastener-flanges. For example, a circuit board assembly may include a solder cover with two sliding-flanges and two fastener-flanges. Such a solder cover would be retained by two retainers and two fasteners.

Alternatively, a circuit board assembly could include a solder cover with three, four or more sliding-flanges and no fastener-flanges. For example, a circuit board assembly could include a solder cover with four sliding-flanges and no fastener-flanges. Such a solder cover would be retained by four retainers. An advantage of such a circuit board assembly is that no holes in the circuit board would be required. Thus, routing of electrical traces would be simplified. In addition, locating components on the circuit board would be simplified.

A circuit board assembly that includes a solder cover that is retained by one or more retainers can comply with stringent shock, vibration and temperature specifications. For example, such a circuit board assembly can comply with the Network Equipment Building Systems (NEBS) GR-63 CORE requirements. As is known by those of skill in the art, NEBS establishes various physical protection standards for earthquakes/vibrations.

5.3 A Method of Assembling a Circuit Board

Figure 4:
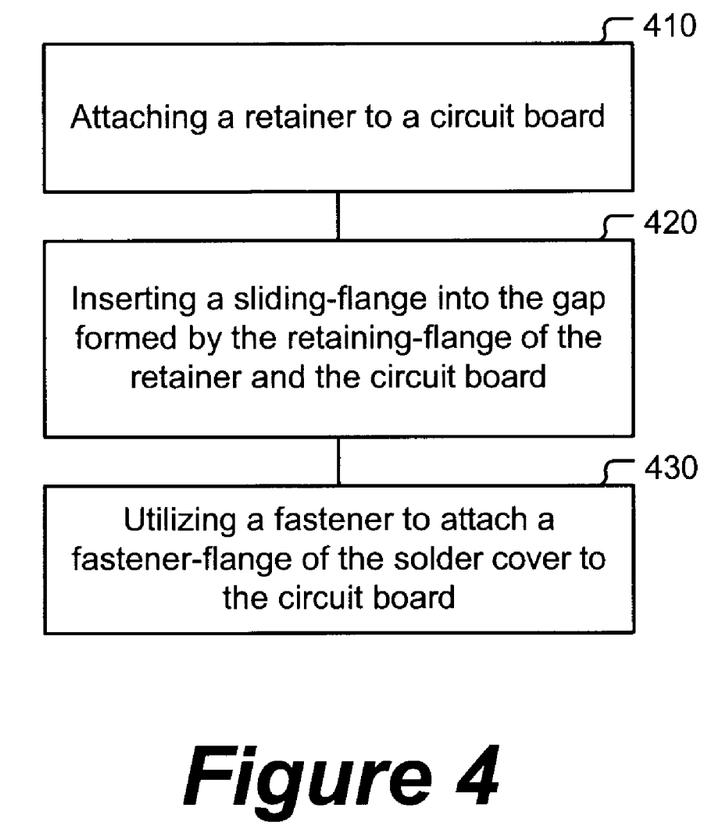
FIG. 4 presents a flow chart of a method of assembling a circuit board.

Another embodiment of the invention is a method of assembling a circuit board assembly. A flow chart of this method is presented in FIG. 4. Referring to Block 410 of FIG. 4, a retainer is first attached to the circuit board. As discussed above, the retainer can be attached to the circuit board by an adhesive or by solder. Next, as shown in Block 420, a sliding-flange of a solder cover is inserted into the gap formed by the retaining-flange of the retainer and the circuit board. Some embodiments of the invention would also include, as shown in Block 430, utilizing a fastener to attach a fastener-flange of the solder cover to the circuit board.

5.4 Conclusion

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

It is claimed:

1. A circuit board assembly comprising:
   a) a circuit board including a plurality of holes for receiving a plurality of fasteners, the circuit board including a plurality of electrical contacts;
   b) a solder cover covering the plurality of electrical contacts, the solder cover including:
      1) a cover;
      2) a plurality of fastener-flanges, each of the plurality of fastener-flanges including a hole, the plurality of fastener-flanges being coupled to the cover; and
      3) a sliding-flange that is coupled to the cover;
   c) a retainer for restraining the solder cover, the retainer comprising:
      1) a mounting-flange, the mounting-flange including a mounting surface being attached to the circuit board; and 2) a retaining-flange, the retaining-flange being coupled to the mounting-flange, the retaining-flange being parallel to but not co-planar to the mounting-flange; and d) a plurality of fasteners, each of the plurality of fasteners passing through one of the plurality of holes in the circuit board and one of the plurality of holes in the fastener-flanges.

2. The circuit board assembly of claim 1, wherein the solder cover does not conduct electricity.

3. The circuit board assembly of claim 1, further including a component that is mounted to the circuit board and wherein the cover of the solder cover includes an access hole for accessing the component through the solder cover.

4. The circuit board assembly of claim 1, wherein the circuit board includes a first surface and the plurality of fastener-flanges of the solder cover each include a surface that mates with the first surface.

5. The circuit board assembly of claim 1, wherein the circuit board includes a first surface and the plurality of fastener-flanges of the solder cover each includes a surface that is co-planar with the first surface.

6. The circuit board assembly of claim 1, wherein the plurality of fastener-flanges of the solder cover each includes a surface that is co-planar with the mounting surface of the retainer.

7. The circuit board assembly of claim 1, wherein the retainer does not conduct electricity.

8. The circuit board assembly of claim 1, wherein the mounting-flange of the retainer includes a hole.

9. The circuit board assembly of claim 1, wherein the retaining-flange of the retainer includes a hole.

10. The circuit board assembly of claim 1, wherein the retainer is attached to the circuit board via an adhesive.

11. The circuit board assembly of claim 1, wherein the retainer is attached to the circuit board via solder.

12. The circuit board assembly of claim 1, wherein the retainer is attached to the circuit board via a fastener.

13. The circuit board assembly of claim 1, wherein the circuit board assembly complies with version 2.0 of the CompactPCI specification.

14. A circuit board assembly comprising:

a) a circuit board including a plurality of electrical contacts;

b) a solder cover covering the plurality of electrical contacts, the solder cover including:
1) a cover; and
2) a sliding-flange that is coupled to the cover;

c) a retainer for restraining the solder cover, the retainer comprising:
1) a mounting-flange, the mounting-flange including a mounting surface being attached to the circuit board; and
2) a retaining-flange, the retaining-flange being coupled to the mounting-flange, the retaining-flange being parallel to but not co-planar to the mounting surface.

15. A method of assembling a circuit board assembly, the method comprising:

a) attaching a retainer to a circuit board, the retainer including a mounting-flange, the mounting-flange including a mounting surface for attaching to the circuit board, the retainer including a retaining-flange, the retaining flange being coupled to the mounting-flange, the retaining-flange being parallel to but not co-planar to the mounting surface;

b) inserting a sliding-flange of a solder cover between at least a portion of the retaining-flange and the circuit board.

16. The method of claim 15, further comprising;

c) attaching a fastener-flange of the solder cover to the circuit board.

17. A solder cover for covering a plurality of exposed electrical contacts, the solder cover including:

a) a cover;

b) a plurality of fastener-flanges, each of the plurality of fastener-flanges including a hole, the plurality of fastener-flanges being coupled to the cover; and c) a sliding-flange that is coupled to the cover, the sliding-flange having a first surface for contacting a circuit board and a second surface, which is parallel to but not co-planer with the first surface, for contacting a retainer, the sliding-flange not including a hole for receiving a fastener.

18. The solder cover of claim 17, wherein the solder cover does not conduct electricity.

19. The solder cover of claim 17, wherein the plurality of fastener-flanges each include a mounting surface that is co-planar with a surface of the sliding-flange.

20. A solder cover for covering a plurality of exposed solder joints, the solder cover including:

a) a cover; and b) a sliding-flange that is coupled to the cover, the sliding-flange having a first surface for contacting a circuit board and a second surface, which is parallel to but not co-planer with the first surface, for contacting a retainer, the sliding-flange not including a hole for receiving a fastener.

21. A retainer for restraining a solder cover, the retainer comprising:

a) a mounting-flange, the mounting-flange including a mounting surface for mounting to a circuit board; and b) a retaining-flange, the retaining-flange being coupled to the mounting-flange and including a retaining surface for retaining a sliding-flange of a solder cover, the retaining surface being parallel to but not co-planar to the mounting surface.

22. The retainer of claim 21, wherein the retainer does not conduct electricity.

23. The retainer of claim 21, wherein the mounting-flange of the retainer includes a plurality of holes for receiving pins.

24. The retainer of claim 21, wherein the retaining-flange of the retainer includes at least one hole.

* * * * *